(12) United States Patent
Feng

(10) Patent No.: US 9,949,393 B1
(45) Date of Patent: Apr. 17, 2018

(54) CABLE MANAGING DEVICE FOR CASE

(71) Applicant: Nzxt Inc., City of Industry, CA (US)

(72) Inventor: Shin Feng, City of Industry, CA (US)

(73) Assignee: NZXT INC., City of Industry, CA (US)

( * ) Notice: Subject to any disclaimer, the term of this patent is extended or adjusted under 35 U.S.C. 154(b) by 0 days.

(21) Appl. No.: 15/692,056

(22) Filed: Aug. 31, 2017

(51) Int. Cl.
*H05K 5/02* (2006.01)
*G06F 1/18* (2006.01)

(52) U.S. Cl.
CPC .......... *H05K 5/0247* (2013.01); *G06F 1/188* (2013.01)

(58) Field of Classification Search
None
See application file for complete search history.

(56) References Cited

U.S. PATENT DOCUMENTS

| | | | | |
|---|---|---|---|---|
| 5,335,349 A * | 8/1994 | Kutsch | ..................... | F16G 13/16 375/257 |
| 6,378,811 B1 * | 4/2002 | Potter | ..................... | F16L 3/222 248/49 |
| 6,528,728 B1 * | 3/2003 | Shima | .................. | H02G 3/0437 174/101 |
| 6,706,969 B1 * | 3/2004 | Young | ...................... | F16L 3/22 174/95 |
| 6,997,412 B2 * | 2/2006 | Komiya | .................. | F16G 13/16 242/615.2 |
| 7,617,669 B1 * | 11/2009 | Komiya | .................. | F16G 13/16 248/49 |
| 7,700,876 B2 * | 4/2010 | Nishikino | ................ | H02G 3/32 174/68.1 |
| 8,074,945 B2 * | 12/2011 | Schoenau | ................. | F16L 5/14 248/316.6 |
| 8,227,694 B2 * | 7/2012 | Murayama | .......... | B60R 16/0207 174/101 |
| 8,254,744 B2 * | 8/2012 | Sayres | ................. | G02B 6/4459 385/137 |
| 8,342,474 B2 * | 1/2013 | Gilbreath | ................ | F16L 3/222 165/162 |
| 8,561,815 B2 * | 10/2013 | Higson | .................. | H05K 7/183 211/41.17 |
| 9,083,159 B2 * | 7/2015 | Takeuchi | ............. | H02G 3/0475 |
| 9,368,951 B2 * | 6/2016 | Komiya | .................. | F16L 3/015 |
| D771,478 S * | 11/2016 | McCoy | .......................... | D8/354 |
| D795,046 S * | 8/2017 | McCoy | .......................... | D8/354 |
| 2004/0112625 A1 * | 6/2004 | Sheikholeslami | ...... | F16G 13/16 174/68.1 |

(Continued)

*Primary Examiner* — Xanthia C Cunningham
(74) *Attorney, Agent, or Firm* — Muncy, Geissler, Olds & Lowe, P.C.

(57) ABSTRACT

A cable managing device for a case is disclosed. The cable managing device includes at least one straight cable manager including a straight base whose sides respectively upward extend to form two first sidewalls and a first accommodation space. At least one curved cable manager includes a curved base whose outer side upward extends to form a second sidewall and a second accommodation space inside the second sidewall. The bottoms of two ends of the curved base are respectively provided with a second male tenon and a second female tenon. One of the tenons is fastened with one of a female tenon and a male tenon at two ends of the straight cable manager to connect the first accommodation space with the second accommodation space, thereby accommodating the cables.

10 Claims, 4 Drawing Sheets

(56) References Cited

U.S. PATENT DOCUMENTS

| | | | | |
|---|---|---|---|---|
| 2012/0257368 A1* | 10/2012 | Bohn | .................... | H04M 1/022 |
| | | | | 361/809 |
| 2012/0267164 A1* | 10/2012 | Reuss | .................. | H02G 3/0487 |
| | | | | 174/70 R |
| 2013/0001375 A1* | 1/2013 | Geng | ....................... | H02G 3/32 |
| | | | | 248/74.3 |

* cited by examiner

CABLE MANAGING DEVICE FOR CASE

BACKGROUND OF THE INVENTION

Field of the Invention

The Present Invention Relates to a Cable Managing Device, and More particularly to a cable managing device for a case.

Description of the Related Art

Computers have strong abilities to process information. Thus, there are many devices in a computer case. Usually, the computer case is provided with a motherboard therein. The motherboard is connected with signal cables for controlling switches, lighting cables, USB 2.0/3.0 cables, audio cables, fan cables, and output cables of a power supply. These cables are respectively connected with their devices, such that the motherboard drives the devices to process various information. As a result, the computer case contains many cables. If the various cables are not ordered, the cables in the computer case are disordered to impair the heat dissipation of the motherboard or result in other problems, thereby decreasing the life of the computer.

Presently, when fabricating a computer case, a steel plate in the computer case is punched to form a rib like a bridge. A line penetrates under the rib and ties the ordered cables to the rib to tighten the cables. However, the rib is a structure formed by directly punching the steel plate. There is a limited space under the rib to allow a thinner line to penetrate. That is to say, diameters of tied cables are also limited. In order to overcome the abovementioned shortcomings, hook and loop fasteners that can be directly fixed to the computer case are invented to tie cables having longer diameters. Although more cables are tied, the cable managing structures have to be fixed to given positions. Thus, all the cables must be ordered according to given positions of the hook and loop fasteners. The hook and loop fasteners lack the elasticity of installation and the maneuverability. Therefore, the hook and loop fasteners do not necessarily meet the cable managing habit and requirement of everyone.

To overcome the abovementioned problems, the present invention provides a cable managing device for a case, so as to solve the afore-mentioned problems of the prior art.

SUMMARY OF THE INVENTION

A primary objective of the present invention is to provide a cable managing device for a case, which is freely combined according to the positions and the directions of ordered cables, thereby achieving the maneuverability.

Another objective of the present invention is to provide a cable managing device for a case, which has a simple structure and the low fabrication cost to improve the production efficiency.

To achieve the abovementioned objectives, the present invention provides a cable managing device for a case. The cable managing device is installed in the case to manage cables in the case. The cable managing device comprises at least one straight cable manager comprising a straight base, and the two sides of the straight base respectively upward extend to form two first sidewalls and a first accommodation space, and the straight base is provided with at least one first separating protrusion thereon located between the first sidewalls, and the bottoms of two ends of the straight base are respectively provided with a first male tenon and a first female tenon; and at least one curved cable manager comprising a curved base, and the outer side of the curved base upward extends to form a second sidewall and a second accommodation space inside the second sidewall, and the center of the curved base is provided with a second separating protrusion, and the bottoms of two ends of the curved base are respectively provided with a second male tenon and a second female tenon, and the first male tenon is fastened with the second female tenon or the first female tenon is fastened with the second male tenon to connect the first accommodation space with the second accommodation space, thereby accommodating the cables.

In an embodiment of the present invention, the cable managing device for the case further comprises at least one L-shaped cable manager located at the edge of the case, and the L-shaped cable manager comprises an L-shaped base, and the two sides of the L-shaped base upward extend to form two third sidewalls and a third accommodation space that accommodates the cables. The L-shaped base is provided with at least one threading fixed bar is tied with a line to fix the cables in the third accommodation space.

In an embodiment of the present invention, each of the straight cable manager, the curved cable manager, and the L-shaped cable manager is fixed to the case through at least one fixing element. The fixing element is a magnet, a screw, or an adhesive tape.

Below, the embodiments are described in detail in cooperation with the drawings to make easily understood the technical contents, characteristics and accomplishments of the present invention.

DETAILED DESCRIPTION OF THE INVENTION

Figure 1:
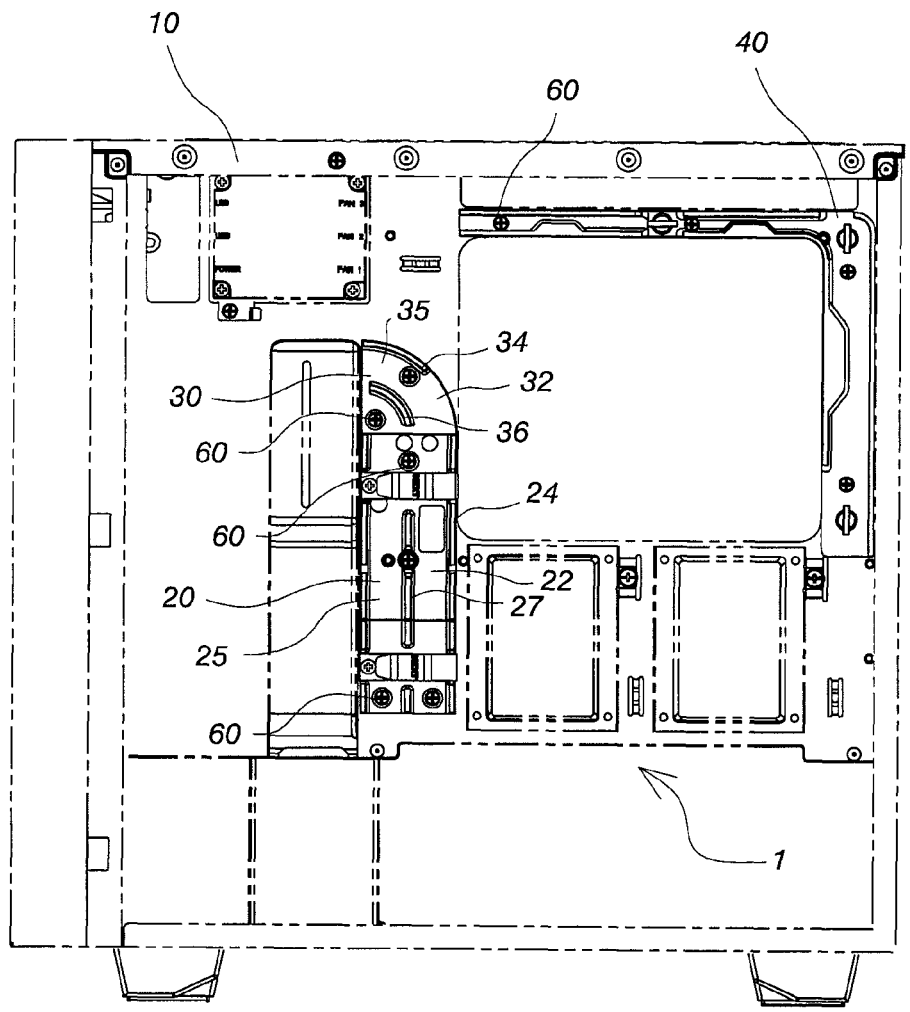
FIG. 1 is a diagram schematically showing a cable managing device arranged in a case according to an embodiment of the present invention.

Refer to FIG. 1. The cable managing device 1 for a case of the present invention is installed in a computer case 10 to manage cables in the computer case 10. In an embodiment, the cable managing device 1 comprises two straight cable managers 20, a curved cable manager 30, and an L-shaped cable manager 40. In the cable managing device 1, the straight cable managers 20 and the curved cable manager 30 are freely combined to achieve the high maneuverability according to the routing directions of cables of the computer case 10.

Figure 2:
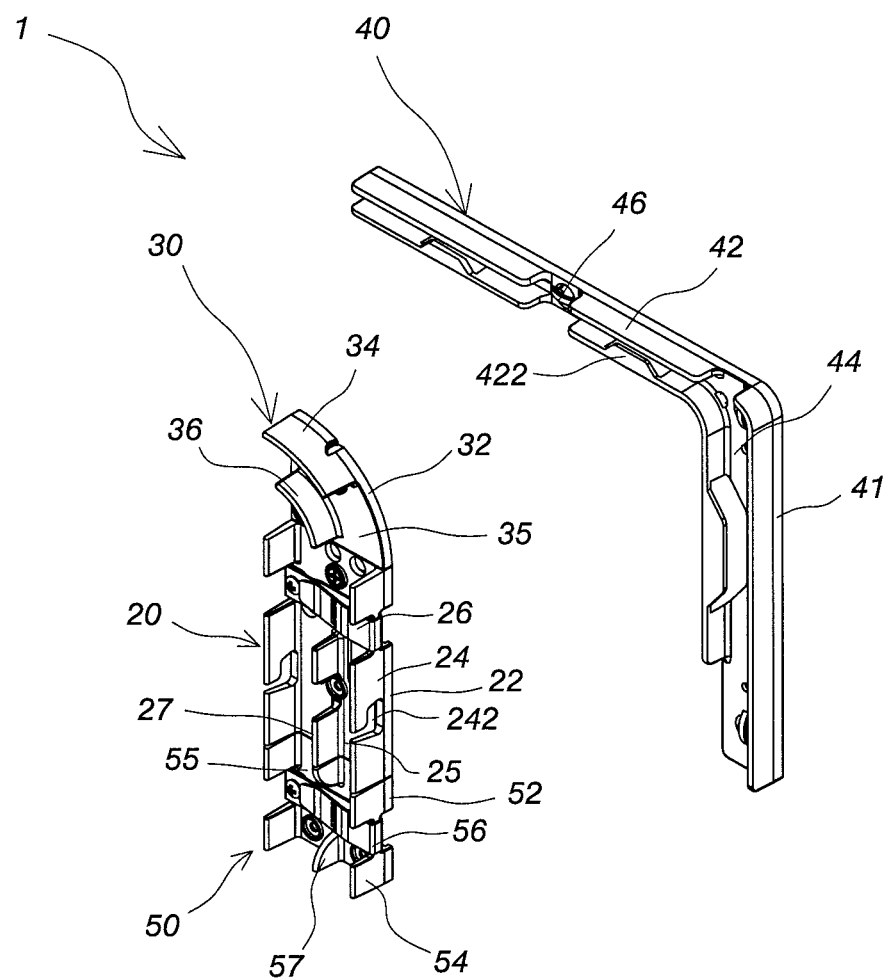
FIG. 2 is a perspective view of a cable managing device for a case according to an embodiment of the present invention.
Figure 3:
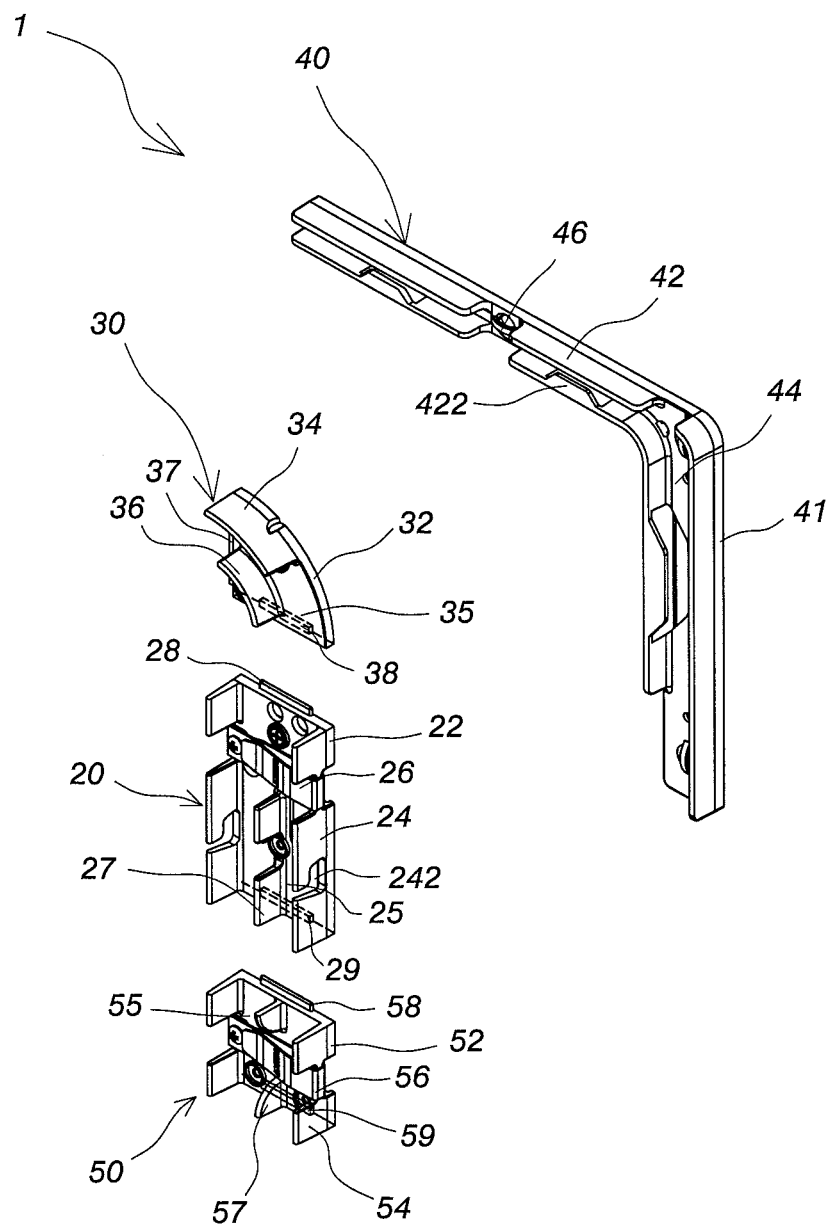
FIG. 3 is an exploded view of a cable managing device for a case according to an embodiment of the present invention.

Refer to FIG. 1 to FIG. 3. The structures of the straight cable manager 20, the curved cable manager 30, and the L-shaped cable manager 40 are described in detail. The straight cable manager 20 has a shape of a rectangular. Alternatively, the straight cable manager 20 is a square cable manager 50. Firstly, the structure of the rectangular cable manager 20 is described. The rectangular cable manager 20 comprises a straight base 22. Two sides of the straight base 22 respectively upward extend to form two first sidewalls 24. The first sidewalls 24 and the straight base 22 form a first accommodation space 25. Each of the two first sidewalls 24 of the straight base 22 is provided with at least one side opening 242. When the cables of the computer case 10 are installed in the first accommodation space 25, the cables exit from the side opening 242 according to requirements. The straight base 22 of the straight cable manager 20 is provided with a cable tie 26 such as a hook and loop fastener to fix the cables in the first accommodation space 25. In addition, the straight base 22 is provided with two first separating protrusions 27 thereon located between the first sidewalls 24. The first separating protrusions 27 are used to separate the cables in the first accommodation space 25. There is a gap between the first separating protrusions 27 to correspond to the side opening 242 of the first sidewall 24, so that the cables exit from the gap. The bottoms of two ends of the straight base 22 are respectively provided with a first male tenon 28 and a first female tenon 29 that are fastened with another cable manager.

Refer to FIG. 1 to FIG. 3. The structure of the square cable manager 50 is described. The structures of the square cable manager 50 and the rectangular cable manager 20 are identical. The square cable manager 50 comprises a straight base 52. Two sides of the straight base 52 respectively upward extend to form two first sidewalls 54. The first sidewalls 54 and the straight base 22 form a first accommodation space 55. The straight base 52 is provided with a cable tie 56 such as a hook and loop fastener to fix the cables. The straight base 52 is provided with two first separating protrusions 57 thereon. The bottoms of two ends of the straight base 52 are respectively provided with a first male tenon 58 and a first female tenon 59 that are fastened with another cable manager. In an embodiment, the square cable manager 50 is fastened with the rectangular cable manager 20 through the first male tenon 58 and the first female tenon 59. The square cable manager 50 is different from the rectangular cable manager 20 in that the first sidewall 54 of the square cable manager 50 does not have any side opening. The other structure of the square cable manager 50 is identical to that of the rectangular cable manager 20 so will not be reiterated.

Refer to FIG. 1 to FIG. 3. The structure of the curved cable manager 30 is described. The curved cable manager 30 comprises a curved base 32. The outer side of the curved base 32 upward extends to form a second sidewall 34 and a second accommodation space 35 inside the second sidewall 34. The second accommodation space 35 is used to accommodate the cables in the computer case 10. The center of the curved base 32 is provided with a second separating protrusion 36. The bottoms of two ends of the curved base 32 are respectively provided with a second male tenon 37 and a second female tenon 38. As a result, the first male tenon 28 or 58 is fastened with the second female tenon 38 or the first female tenon 29 or 59 is fastened with the second male tenon 37 to connect the curved base 32 with either of the rectangular cable manager 20 or the square cable manager 50. Then, the second accommodation space 35 of the curved cable manager 32 is connected with either of the first accommodation space 25 of the rectangular cable manager 20 or the first accommodation space 55 of the square cable manager 50 to accommodate the cables.

The structure of the L-shaped cable manager 40 is described in detail. The L-shaped cable manager 40 comprises an L-shaped base 41, and two sides of the L-shaped base 41 upward extend to form two third sidewalls 42 and a third accommodation space 44 that accommodates the cables in the computer case 10. The third sidewall 42 of the L-shaped cable manager 40 inward vertically extends to form a wiring blocking board 422, which is used to effectively confine the cables in the third accommodation space 44 lest the cables emerge from the L-shaped cable manager 40. The L-shaped base 41 is provided with at least one threading fixed bar 46. Like an arch bridge, the threading fixed bar 46 is slightly protruded up from the L-shaped base 41. A line 48 penetrates under the bottom of the threading fixed bar 46 to fix the cables in the third accommodation space 44.

The bottoms of the rectangular cable manager 20, the square cable manager 50, the curved cable manager 30, and the L-shaped cable manager 40 touching the computer case 10 are the bottoms of the straight bases 22 and 52, the curved base 32 and the L-shaped base 41. Each of the bottoms of the straight bases 22 and 52, the curved base 32 and the L-shaped base 41 is provided with at least one fixing element 60. The fixing element 60 is a magnet, a screw, or an adhesive tape. The magnetic force of the magnet attracts the iron frame of the computer case 10. Alternatively, the screw is directly screwed to the computer case 10. Or otherwise, the adhesive tape directly adheres to the computer case 10.

Figure 4:
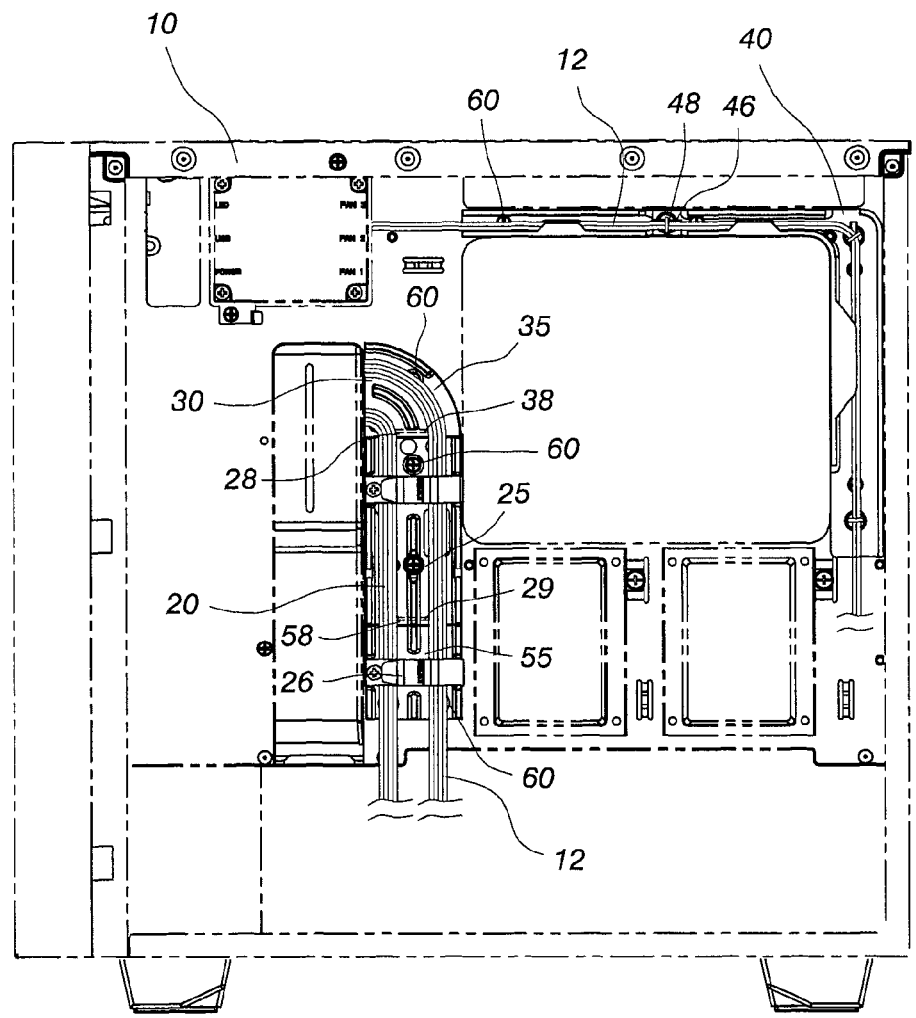
FIG. 4 is a diagram schematically showing the state of using a cable managing device for a case according to an embodiment of the present invention.

After describing the structure of the cable managing device 1, the state of using the cable managing device 1 in the computer case 10 is described, as shown in FIG. 4. The embodiment exemplifies a rectangular cable manager 20, a square cable manager 50, a curved cable manager 30, and an L-shaped cable manager 40. The first male tenon 58 of the square cable manager 50 is fastened with the first female tenon 29 of the rectangular cable manager 20. The first male tenon 28 of the rectangular cable manager 20 is fastened with the second female tenon 37 of the curved cable manager 30. Thus, the rectangular cable manager 20, the square cable manager 50, and the curved cable manager 30 are combined with each other to connect the first accommodation spaces 25 or 55 with the second accommodation space 35. Thus, the first accommodation spaces 25 or 55 and the second accommodation space 35 can both accommodate a cable 12. Certainly, the second female tenon 37 and the second male tenon 37 of the curved cable manager 30 can be freely fastened with the first male tenon 58 or the first female tenon 37 of the square cable manager 50. Alternatively, the first male tenon 28 of the rectangular cable manager 20 is fastened with the first female tenon 59 of the square cable manager 50 according to requirements. The male tenon can be fastened with the female tenon. The present invention does not limit the abovementioned embodiments. The L-shaped cable manager 40 is installed at the vertical corner of the computer case 10 to manage the cable 12 at the vertical corner.

Refer to FIG. 4. The rectangular cable manager 20, the square cable manager 50, the curved cable manager 30, and the L-shaped cable manager 40 are screwed to the computer case 10 through the fixing elements 60. In the embodiment, the fixing elements are exemplified by screws, which fix the rectangular cable manager 20, the square cable manager 50, the curved cable manager 30, and the L-shaped cable manager 40 to the computer case 10. Afterwards, the cable 12 is moved to the first accommodation spaces 25 or 55 and the second accommodation space 35. The cable ties 26 of the straight cable managers 20 and 50 are used to tie and tighten the cable 12 lest the cable 12 be disordered. Similarly, the cable 12 is moved to the third accommodation space 44 of the L-shaped cable manager 40. The threading fixed bar 46 of the L-shaped base 41 is tied with a line 48 to fix the cables 12 in the third accommodation space 44 of the L-shaped cable manager 40. The line 48 is used to tie and tighten the cable 12 lest the cable 12 be disordered.

In conclusion, the cable managing device for a case of the present invention is freely combined according to the positions and the directions of ordered cables, thereby achieving the maneuverability. In addition, the cable managing device has a simple structure and the low fabrication cost to improve the production efficiency.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A cable managing device for a case, said cable managing device installed in said case to manage cables in said case, and said cable managing device comprising:
   at least one straight cable manager comprising a straight base, and two sides of said straight base respectively upward extend to form two first sidewalls and a first accommodation space, and said straight base is provided with at least one first separating protrusion thereon located between said first sidewalls, and bottoms of two ends of said straight base are respectively provided with a first male tenon and a first female tenon; and
   at least one curved cable manager comprising a curved base, and an outer side of said curved base upward extends to form a second sidewall and a second accommodation space inside said second sidewall, and a center of said curved base is provided with a second separating protrusion, and bottoms of two ends of said curved base are respectively provided with a second male tenon and a second female tenon, and said first male tenon is fastened with said second female tenon or said first female tenon is fastened with said second male tenon to connect said first accommodation space with said second accommodation space, thereby accommodating said cables.

2. The cable managing device for the case according to claim 1, further comprising at least one L-shaped cable manager located at an edge of said case, and said at least one L-shaped cable manager comprises an L-shaped base, and two sides of said L-shaped base upward extend to form two third sidewalls and a third accommodation space that accommodates said cables.

3. The cable managing device for the case according to claim 2, wherein said L-shaped base is provided with at least one threading fixed bar tied with a line to fix said cables in said third accommodation space.

4. The cable managing device for the case according to claim 2, wherein said third sidewall of said at least one L-shaped cable manager inward vertically extends to form a wiring blocking board.

5. The cable managing device for the case according to claim 1, wherein each of said two first sidewalls of said at least one straight cable manager is provided with at least one side opening, and said cables exit from said at least one side opening.

6. The cable managing device for the case according to claim 1, wherein said straight base is provided with a cable tie to fix said cables in said first accommodation space.

7. The cable managing device for the case according to claim 6, wherein said cable tie is a hook and loop fastener.

8. The cable managing device for the case according to claim 2, wherein each of said at least one straight cable manager, said at least one curved cable manager, and said at least one L-shaped cable manager is fixed to said case through at least one fixing element.

9. The cable managing device for the case according to claim 8, wherein said at least one fixing element is a magnet, a screw, or an adhesive tape.

10. The cable managing device for the case according to claim 1, wherein said at least one straight cable manager has a shape of a square or a rectangular.

* * * * *